United States Patent
Yu et al.

(10) Patent No.: US 11,742,383 B2
(45) Date of Patent: Aug. 29, 2023

(54) SEMICONDUCTOR DEVICE WITH AIR GAP

(71) Applicant: Winbond Electronics Corp., Taichung (TW)

(72) Inventors: Ping-Lung Yu, Taichung (TW); Po-Chun Shao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/845,992

(22) Filed: Jun. 21, 2022

(65) Prior Publication Data

US 2022/0320274 A1    Oct. 6, 2022

Related U.S. Application Data

(62) Division of application No. 17/219,912, filed on Apr. 1, 2021, now Pat. No. 11,417,727.

(30) Foreign Application Priority Data

Apr. 13, 2020  (TW) .................... 109112335

(51) Int. Cl.
  *H01L 29/00*  (2006.01)
  *H01L 29/94*  (2006.01)
  (Continued)

(52) U.S. Cl.
  CPC .. *H01L 29/0649* (2013.01); *H01L 21/823481* (2013.01)

(58) Field of Classification Search
  CPC ......... H01L 29/0649; H01L 21/823481; H01L 21/764; H01L 27/11536; H01L 21/823437; H01L 21/823456; H01L 27/088
  (Continued)

(56) References Cited

U.S. PATENT DOCUMENTS 9,035,419 B2 *  5/2015  Oh .................. H01L 21/764
                                                  257/E21.573
9,281,314 B1    3/2016  Kashimura et al.
  (Continued)

FOREIGN PATENT DOCUMENTS

CN    103515216    1/2014
KR    20090014628    2/2009

OTHER PUBLICATIONS

"Office Action of China Counterpart Application", dated May 9, 2023, p. 1-p. 6.

*Primary Examiner* — Theresa T Doan
(74) *Attorney, Agent, or Firm* — JCIPRNET

(57) ABSTRACT

A semiconductor device with an air gap includes a plurality of gate stacks disposed on a substrate; a liner layer conformally covering the gate stacks and the substrate; and a dielectric stack disposed on the liner layer on the gate stacks. The air gap is formed between the liner layer and the dielectric stack on two adjacent gate stacks. A height of the air gap is greater than heights of the two adjacent gate stacks, and the air gap includes: a lower portion between the two adjacent gate stacks, sidewalls and a bottom of the lower portion exposing the liner layer; a middle portion above the lower portion; and an upper portion above the middle portion. Sidewalls of the upper portion expose the dielectric stack, a top surface of the upper portion is covered by the dielectric stack, and the upper portion has a smaller width than the lower portion.

20 Claims, 7 Drawing Sheets

(51) Int. Cl.
*H01L 29/06* (2006.01)
*H01L 21/8234* (2006.01)

(58) Field of Classification Search
USPC .......................................... 257/506
See application file for complete search history.

(56) References Cited

U.S. PATENT DOCUMENTS

2015/0060986 A1    3/2015  Fujitsuka et al.
2019/0385892 A1*  12/2019  Singh .................. H01L 21/3065

* cited by examiner

SEMICONDUCTOR DEVICE WITH AIR GAP

CROSS-REFERENCE TO RELATED APPLICATION

This application is a divisional application of and claims the priority benefit of U.S. application Ser. No. 17/219,912, filed on Apr. 1, 2021, which claims the priority benefit of Taiwan application serial no. 109112335, filed on Apr. 13, 2020. The entirety of each of the above-mentioned patent applications is hereby incorporated by reference herein and made a part of this specification

BACKGROUND OF THE INVENTION

1. Field of the Invention

The invention relates to an integrated circuit and a method of fabricating the same, and in particular to a semiconductor device having an air gap and a method of fabricating the same.

2. Description of Related Art

Non-volatile memories are widely used in personal computers and electronic devices because of its ability of data stored, read, and erase of multiple times operation and the advantage of non-volatile memories are the data stored will not be disappeared when the power supply is interrupted, short data access time, and low power consumption. Therefore, non-volatile memories have now become one of the memories broadly used in personal computers and electronic devices.

Under the current trend of enhancing the level of integration of memory devices, the dimensions of the devices are shrunk according to the design rules. In this case, in order to prevent the coupling interference between floating gates from increasing and further improve the gate coupling rate, the above problem is solved by forming an air gap between the stacked gate stacks. However, at present, the volume of the air gap formed between the stacked gate stacks is relatively small, and the shape and height of the air gap in current process method could not be controlled effectively.

SUMMARY OF THE INVENTION

The invention provides an air gap with uniform height and shape and relatively large volume which can be formed without an additional photolithography process.

A semiconductor device with an air gap is provided in an embodiment of this invention. The semiconductor device includes: a plurality of gate stacks disposed on a substrate; a liner layer conformally covering the plurality of gate stacks and the substrate; and a dielectric stack on the liner layer on the plurality of gate stacks. The air gap is formed between the liner layer and the dielectric stack on two adjacent gate stacks, a height of the air gap is greater than heights of the two adjacent gate stacks, and the air gap includes: a lower portion, a middle portion and a bottom portion, the lower portion located between the two adjacent gate stacks, the sidewall and the bottom of the lower portion exposing the liner layer; the middle portion located above the lower portion; and the upper portion located above the middle portion, sidewalls of the upper portion exposing the dielectric stack, a top surface of the upper portion covered by the dielectric stack, and a width of the upper portion being smaller than a width of the lower portion.

A method of fabricating a semiconductor device with an air gap is also provided in another embodiment of this invention. The method includes: forming a plurality of gate stacks on a substrate; forming a liner layer conformally on the plurality of gate stacks and the substrate; forming a first dielectric layer on the substrate, the first dielectric layer covering the liner layer on the plurality of gate stacks and covering a portion of the liner layer between the plurality of gate stacks; forming a second dielectric layer on the first dielectric layer, wherein thicknesses of the second dielectric layer and the first dielectric layer on a gap between the plurality of gate stacks are smaller than thicknesses of the second dielectric layer and the first dielectric layer on the plurality of gate stacks; performing an etching process without a patterned mask to remove the second dielectric layer and the first dielectric layer above the gap, and removing the first dielectric layer between the plurality of gate stacks to expose the liner layer; and forming a third dielectric layer on the second dielectric layer to form the air gap between the plurality of gate stacks, the first dielectric layer, the second dielectric layer, and the third dielectric layer.

An air gaps of uniform height and shape with a relatively large volume without the need for an additional lithography process is also provided in an embodiment of this invention. Therefore, the invention provides a fabrication method that can reduce process steps, save fabricating costs, and have high reliability.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
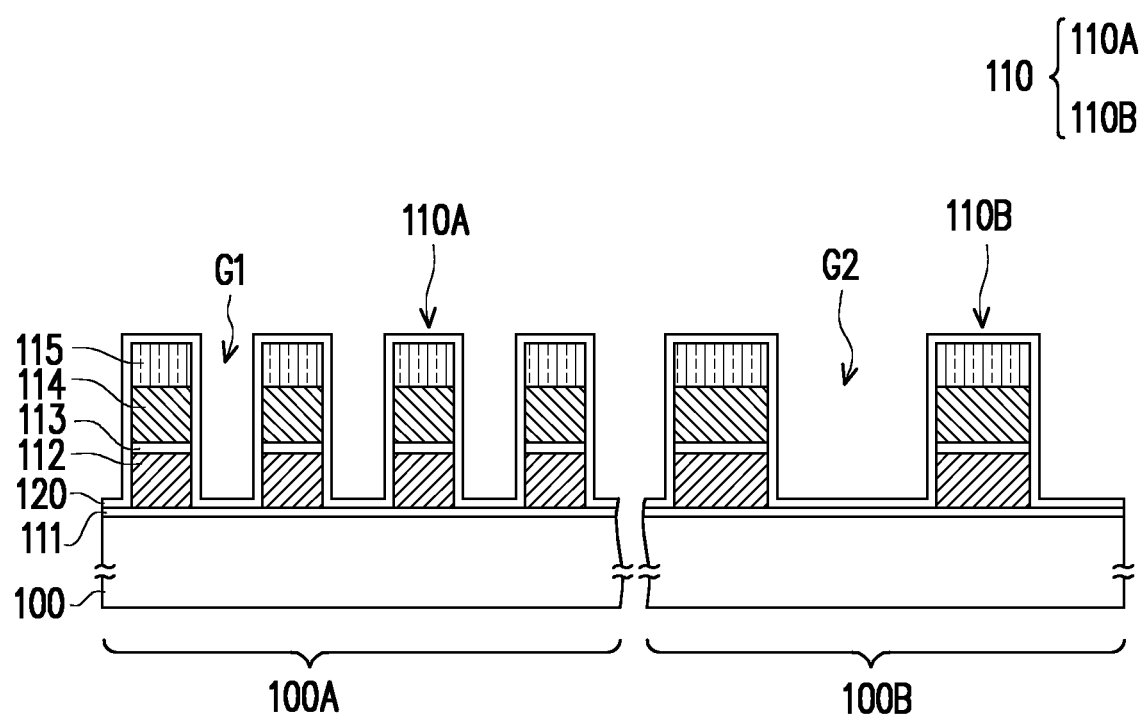
FIGS. 1A to 1F are schematic cross-sectional views illustrating a method of fabricating a semiconductor device with an air gap according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

The invention will be explained more fully with reference to the drawings of this embodiment. However, the invention may also be embodied in various forms, and should not be limited to the embodiments described herein. The thickness of the layers and regions in the drawings will be exaggerated for clarity. Identical or similar reference numerals indicate identical or similar devices and will not be repeated in the following paragraphs.

Referring to FIG. 1A, A method of fabricating a semiconductor device in this embodiment is in the following steps. First, a substrate 100 is provided, the substrate 100 being, for example, a silicon substrate. Next, a plurality of gate stacks 110 are formed on the substrate 100. The gate stacks 110 include a plurality of gate stacks 110A and 110B located on regions 100A and 100B of the substrate 100, respectively. The gate stack 110A is, for example, a word line of a non-volatile storage device, which includes a tunneling dielectric layer 111, a conductive layer 112, an intergate dielectric layer 113, a conductive layer 114, and a metal layer (or metal silicide layer) 115 sequentially stacked on the substrate 100. The material of the tunneling dielectric layer 111 is, for example, silicon oxide. The conductive layer 112 is used as a floating gate, and the material of the conductive layer 112 is, for example, doped polysilicon. The intergate dielectric layer 113 is, for example, an oxide-nitride-oxide (ONO) composite layer formed of silicon oxide, silicon nitride, and silicon oxide-nitride. The conductive layer 114 is used as a control gate, and the material of the conductive layer 114 is, for example, doped polysilicon. The material of the metal layer (or metal silicide layer) 115 may be tungsten, nickel silicide, or cobalt silicide. The conductive layer 114 and the metal layer (or metal silicide layer) 115 may be strip-shaped structures along the direction of penetrating into the drawings. The gate stack 110B may have a similar or different structure to the gate stack 110A. A gap G1 between the gate stacks 110A is smaller and a gap G2 between the gate stacks 110B is larger.

Next, a liner layer 120 is formed on the substrate 100 to cover the upper surfaces and sidewalls of the plurality of gate stacks 110 and the surface of the tunneling dielectric layer 111. The liner layer 120 is, for example, a conformal silicon nitride layer or a silicon oxide layer.

Figure 1B:
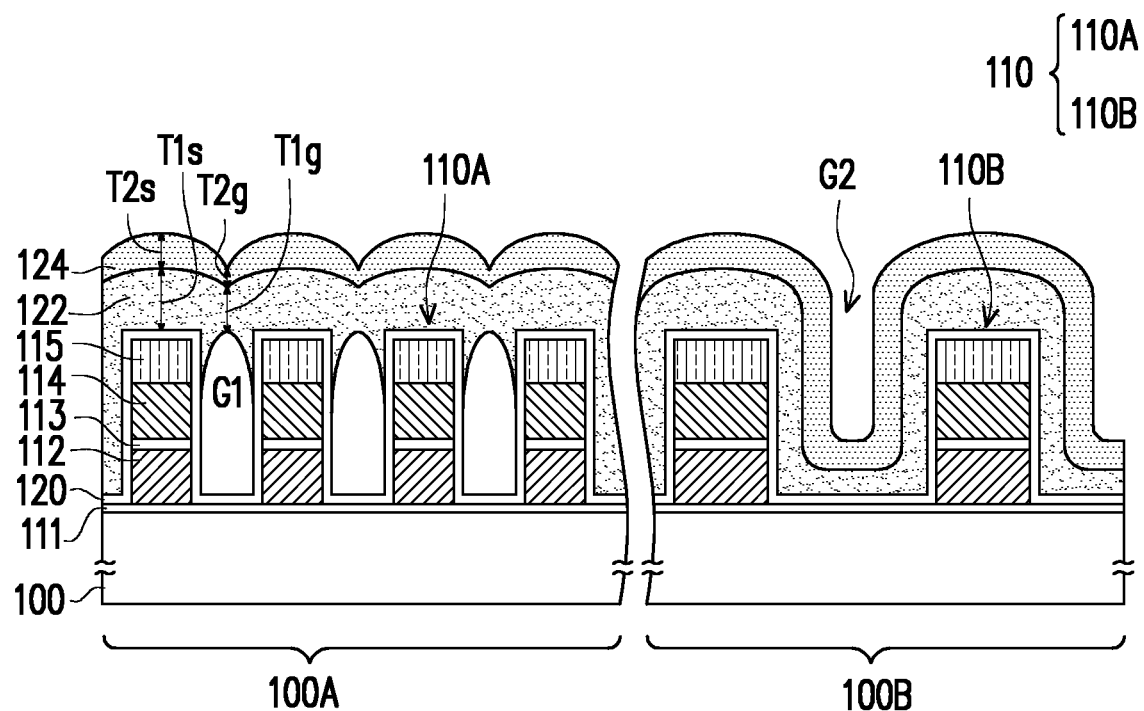

Referring to FIG. 1B, a first dielectric layer 122 and a second dielectric layer 124 are formed on the substrate 100. The first dielectric layer 122 covers the gate stacks 110 and the liner layer 120 on the gap G2 and covers a portion of the liner layer 120 on the gap G1, thus having a curved upper surface. The second dielectric layer 124 covers the first dielectric layer 122 and has curved upper and lower surfaces. The material of the first dielectric layer 122 is different from the material of the liner layer 120. The material of the second dielectric layer 124 and the first dielectric layer 122 may be the same, but have different etching properties. The first dielectric layer 122 and the second dielectric layer 124 may be silicon oxide deposited by different methods; for example, the first dielectric layer 122 is a loosely structured silicon oxide, while the second dielectric layer 124 is a more densely structured silicon oxide. For example, the first dielectric layer 122 is tetraethoxysilane (TEOS)-based silicon oxide formed using TEOS as a gas source; the second dielectric layer 124 is methane-based silicon oxide formed by using methane as a gas source. In an example where the first dielectric layer 122 is TEOS-based oxide, the first dielectric layer 122 may be formed by performing a chemical vapor deposition (CVD) process under the conditions of 200-600 degrees Celsius, 1-10 torr pressure, and 50-2000 watts of RF power, using 0.1-10 gm of TOES, 500-15000 sccm of $O_2$, 100-15000 sccm of $N_2O$, 100-30000 sccm of $N_2$, and 100-15000 sccm He as reaction gas and carrier gas. In an example where the second dielectric layer 124 is methane-based oxide, the second dielectric layer 124 is formed by performing chemical vapor deposition process under the conditions of 200-600 degrees Celsius, 1-10 torr pressure, and 50-2000 watts of RF power, using 10-1000 sccm of methane, 100-15000 sccm of $N_2O$, 100-30000 sccm of $N_2$, and 100 to 15000 sccm of He as reaction gas and carrier gas.

Alternatively, the material of the second dielectric layer 124 may be different from the material of the first dielectric layer 122. For example, the first dielectric layer 122 is silicon oxide, and the second dielectric layer 124 may be silicon nitride or silicon oxynitride. In the example where the first dielectric layer 122 is a silicon oxide, the first dielectric layer 122 may be TEOS-based oxide or methane-based oxide. In the example where the second dielectric layer 124 is silicon nitride or silicon oxynitride, the second dielectric layer 124 may be formed by performing a chemical vapor deposition process under the conditions of 200-600 degrees Celsius, 1-10 torr pressure, and 100-2000 watts of RF power, using 10-1000 sccm of methane, 10-500 sccm $NH_3$, 500-30000 sccm of $N_2$, and 100-15000 sccm $N_2O$ as reaction gas and carrier gas.

Since the gaps G1 and G2 exist between the gate stacks 110, the first dielectric layer 122 and the second dielectric layer 124 will fluctuate according to the contour of the surface of the substrate 100. Moreover, the first dielectric layer 122 and the second dielectric layer 124 are non-conformal layers. Since the gap G1 exist between the gate stacks 110A is smaller, the top end of the gap G1 is sealed by the overhang of the first dielectric layer 122, and a thickness T2$g$ of the second dielectric layer 124 and a thickness T1$g$ of the first dielectric layer 122 are respectively smaller than a thickness T2$s$ of the second dielectric layer 124 and a thickness T1$s$ of the first dielectric layer 122 on the gate stacks 110. For example, T1$s$ is 10 nm to 200 nm; T1$g$ is 1 nm to 100 nm. The ratio of T1$s$ to T1$g$ is, for example, 200:1 to 1.5:1. For example, T2$s$ is 10 nm to 200 nm; T2$g$ is 1 nm to 100 nm. The ratio of T2$s$ to T2$g$ is, for example, 200:1 to 1.5:1. The ratio of T1$s$/T2$s$ is, for example, 0.1:1 to 20:1. The ratio of T1$g$/T2$g$ is, for example, 0.1:1 to 20:1. Since the gap G2 between the gate stacks 110B is large, the gap G2 is not filled by the second dielectric layer 124 and the first dielectric layer 122.

Figure 1C:
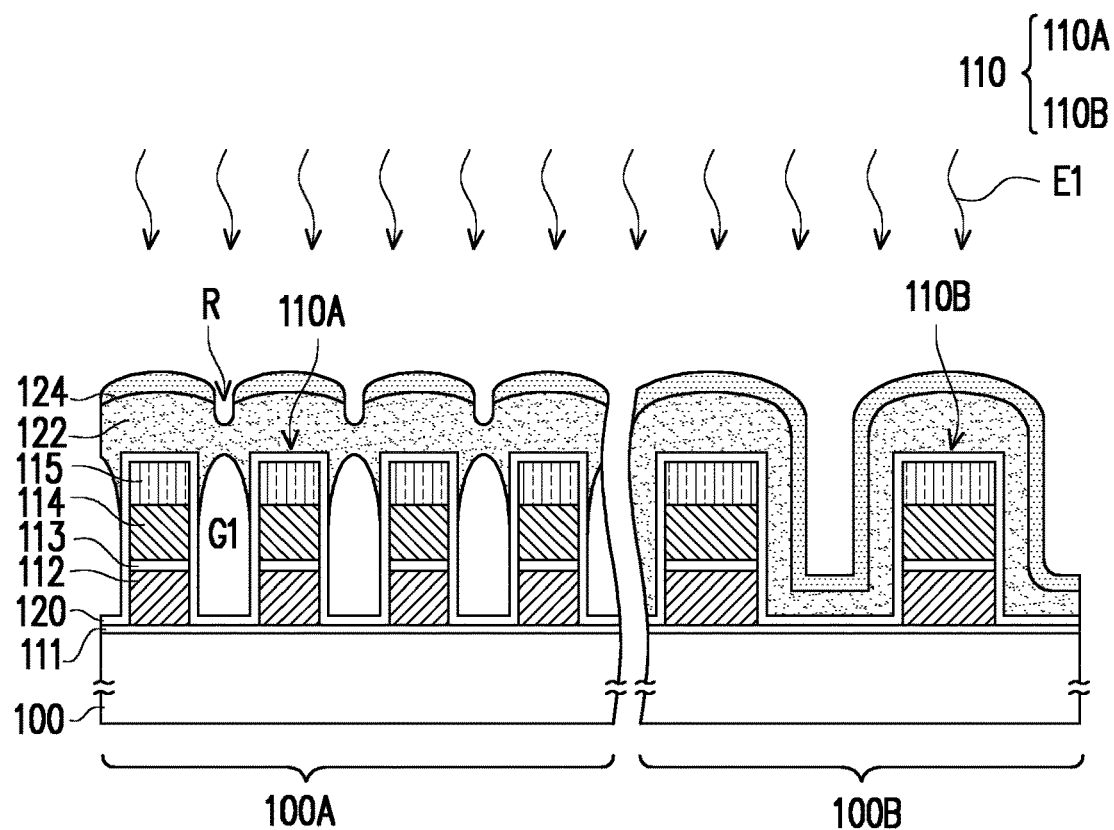

Referring to FIG. 1C, a first etching process E1 is performed on the second dielectric layer 124. Since the thickness T2$g$ of the second dielectric layer 124 on the gap G1 between the gate stacks 110A is smaller than the thickness T2$s$ of the second dielectric layer 124 on the gate stacks 110A, the thickness T2$g$ of the second dielectric layer 124 on the gap G1 between the gate stacks 110A is first etched away to form a groove R exposing the first dielectric layer 122, while the first dielectric layer 122 on the gate stacks 110A remains covered by the second dielectric layer 124. By the thickness difference of the second dielectric layer 124 between the gate stack 110A and the gap G1, the groove R exposing the first dielectric layer 122 can be directly formed above the gap G1 by a dry etching process without the need to define the position of the groove R through an additional photolithography process.

Figure 1D:
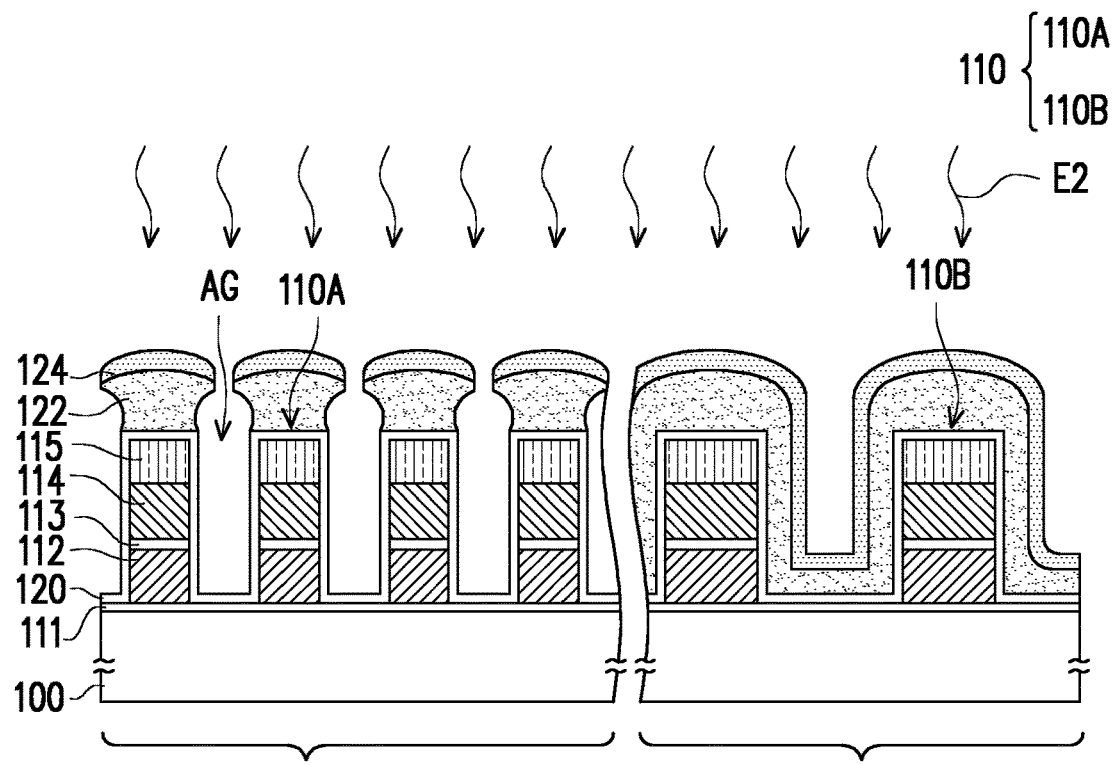

Referring to FIG. 1D, a second etching process E2 is performed on the first dielectric layer 122 exposed the groove R. This etching process may be an isotropic etching process, such as a wet etching process. In the second etching process, the second dielectric layer 124 has a lower etching rate and therefore may be used as a hard mask layer. Furthermore, in the second etching process, the first dielectric layer 122 has a higher etching rate, and due to the loading effect of etching, even if the groove R exposes only a small area of the first dielectric layer 122, the first dielectric layer 122 may also be etched quickly to form an air gap AG larger than the groove R. During the second etching process, since the liner layer 120 and the first dielectric layer 122 have sufficient etching selectivity, the liner layer 120 may be used as a protective layer for the gate stack 110, and ensure that the first dielectric layer 122 in the gap G1 can be completely removed. For example, the etching selectivity of the second dielectric layer 124 to the first dielectric layer 122 is 1:1.5 to 1:100.

Figure 1E:
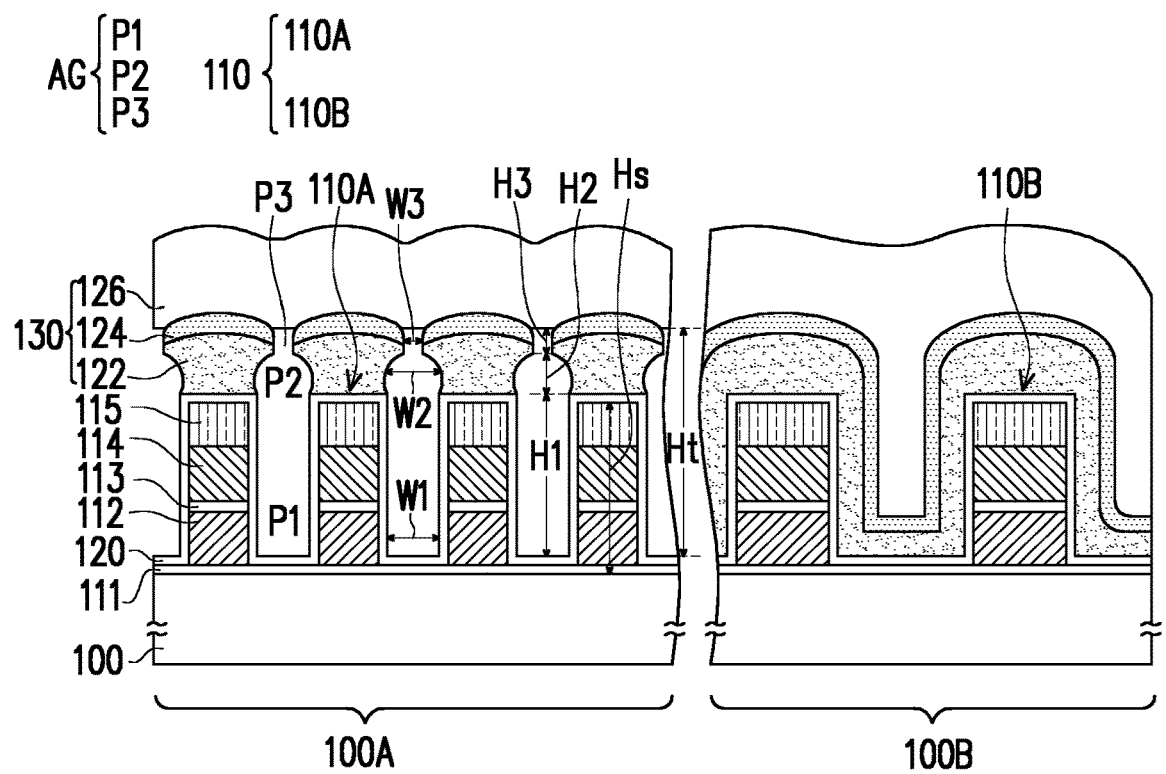

Referring to FIG. 1E, a third dielectric layer 126 is formed on the second dielectric layer 124 to seal the air gap AG. The third dielectric layer 126 is, for example, silicon oxide, silicon nitride, or silicon oxynitride. The first dielectric layer 122, the second dielectric layer 124, and third dielectric layer 126 may be collectively referred to as a dielectric stack 130.

The air gaps AG have approximately the same height and shape. A height Ht of the air gap AG is greater than a height Hs of the gate stack 110A. The air gap AG may include a lower portion P1, a middle portion P2, and an upper portion P3. The lower portion P1 is located between two adjacent gate stacks 110. The sidewalls and bottom of the lower portion P1 expose the liner layer 120, and the liner layer 120 is completely not covered by the first dielectric layer 122 of the dielectric stack 130. The middle portion P2 is located above the lower portion P1, and the sidewalls of the middle portion P2 expose the first dielectric layer 122 of the dielectric stack 130. The sidewalls of the middle portion P2 may be curved. The upper portion P3 is located above the middle portion P2, the top surface of the upper portion P3 is covered by the third dielectric layer 126 of the dielectric stack 130, and the sidewalls of the upper portion P3 expose the second dielectric layer 124 of the dielectric stack 130. The sidewalls of the upper portion P3 may be vertical or inclined.

The heights of the lower portion P1, the middle portion P2, and the upper portion P3 of the air gap AG may be determined according to the heights and the thicknesses of the gate stack 110A, the first dielectric layer 122, and the second dielectric layer 124. The sum (H2+H3) of the heights of the middle portion P2 and the upper portion P3 may be less than, equal to, or greater than the height H1 of the lower portion P1. For example, the ratio of the height sum (H2+H3) of the middle portion P2 and the upper portion P3 to the height H1 of the lower portion P1 is 0.01:1 to 1:1.2.

The widths of the lower portion P1, the middle portion P2, and the upper portion P3 of the air gap AG may be controlled according to the width of the gap G1 between the gate stacks 110A, the thickness of the liner layer 120, and the conditions of the first etching process and the second etching process. The width (maximum width) W2 of the middle portion P2 may be greater than the width W3 of the upper portion P3 and greater than or equal to the width W1 of the lower portion P1. The width W3 of the upper portion P3 may be smaller than the width W2 of the middle portion P2 and smaller than the width W1 of the lower portion P1. For example, the ratio of W2/W1 is 0.01:1 to 2:1, and the ratio of W3/W1 is 0.001:1 to 0.5:1.

Figure 1F:
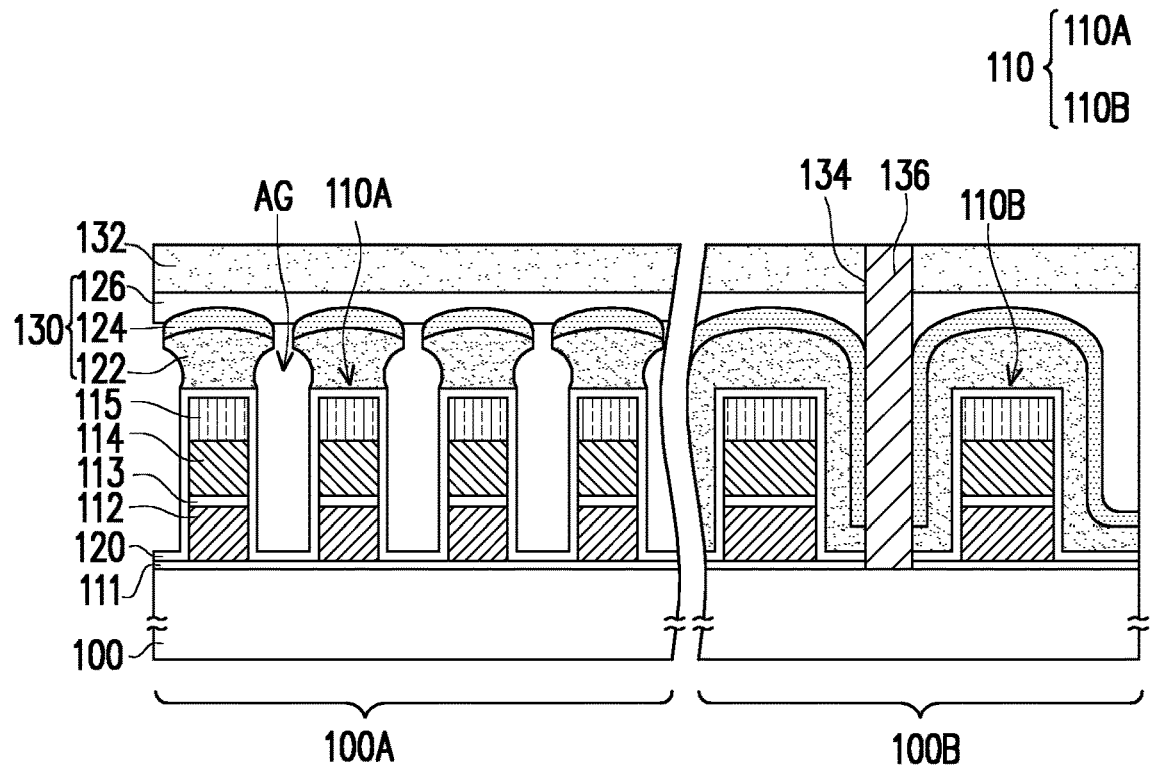

Referring to FIG. 1F, the third dielectric layer 126 is planarized by performing a chemical mechanical polishing process so that the third dielectric layer 126 has a lower surface with a curved profile and a flat upper surface. Then, a cap hard mask layer 132 is formed on the third dielectric layer 126. The material of the cap hard mask layer 132 is, for example, silicon nitride, silicon oxide, or silicon oxynitride. After that, subsequent processes, such as forming a contact opening 134 exposing the substrate 100 in the cap hard mask layer 132 and the dielectric stack 130 of the region 100B and forming a conductor plug 136 in the contact opening 134, etc., may be performed.

FIGS. 2A to 2G are schematic cross-sectional views illustrating a method of fabricating a semiconductor device with an air gap according to an embodiment of the invention.

Figure 2A:
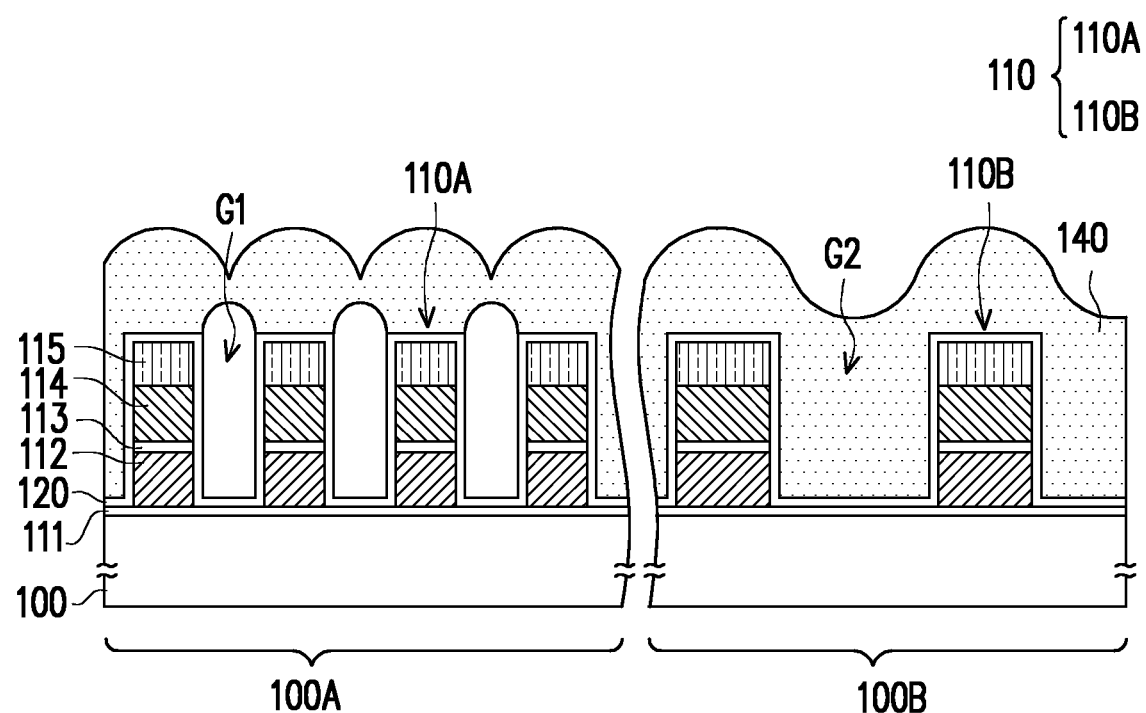
FIGS. 2A to 2G are schematic cross-sectional views illustrating a method of fabricating a semiconductor device with an air gap according to an embodiment of the invention.

Referring to FIG. 2A, in another embodiment, a filler material layer 140 may be formed first after the liner layer 120 is formed on the substrate 100. The filler material layer 140 is a non-conformal layer, which cannot fill the gap G1 between the gate stacks 110A but can fill the gap G2 between the gate stacks 110B.

Figure 2B:
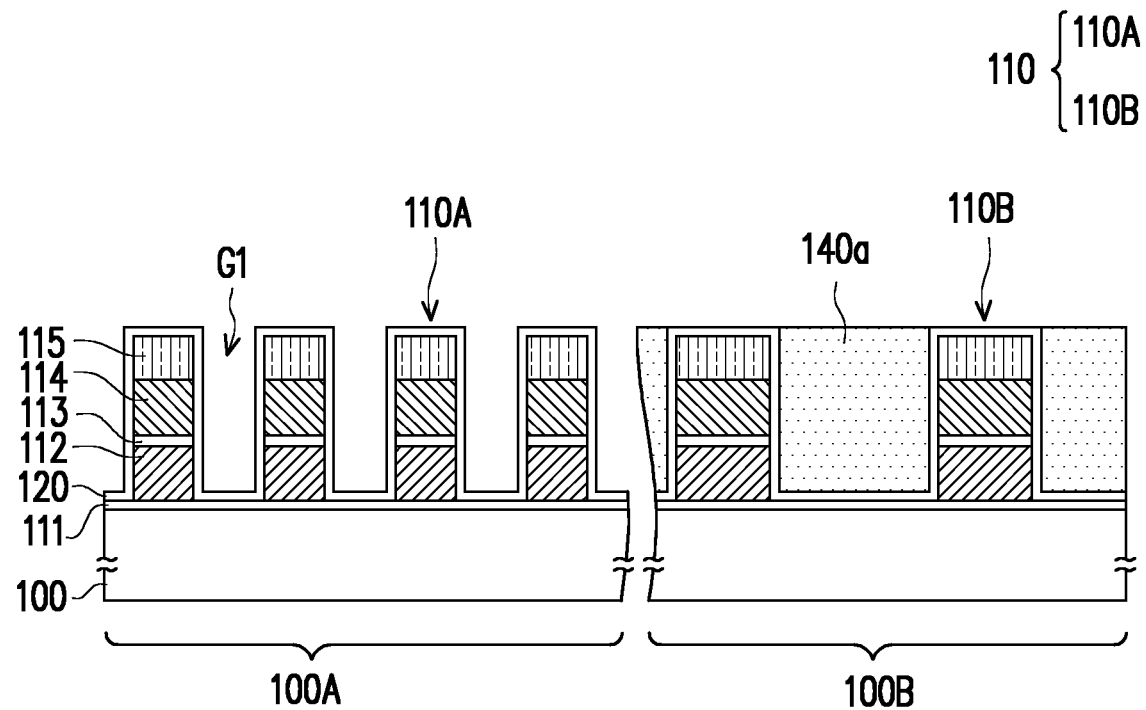
Figure 2C:
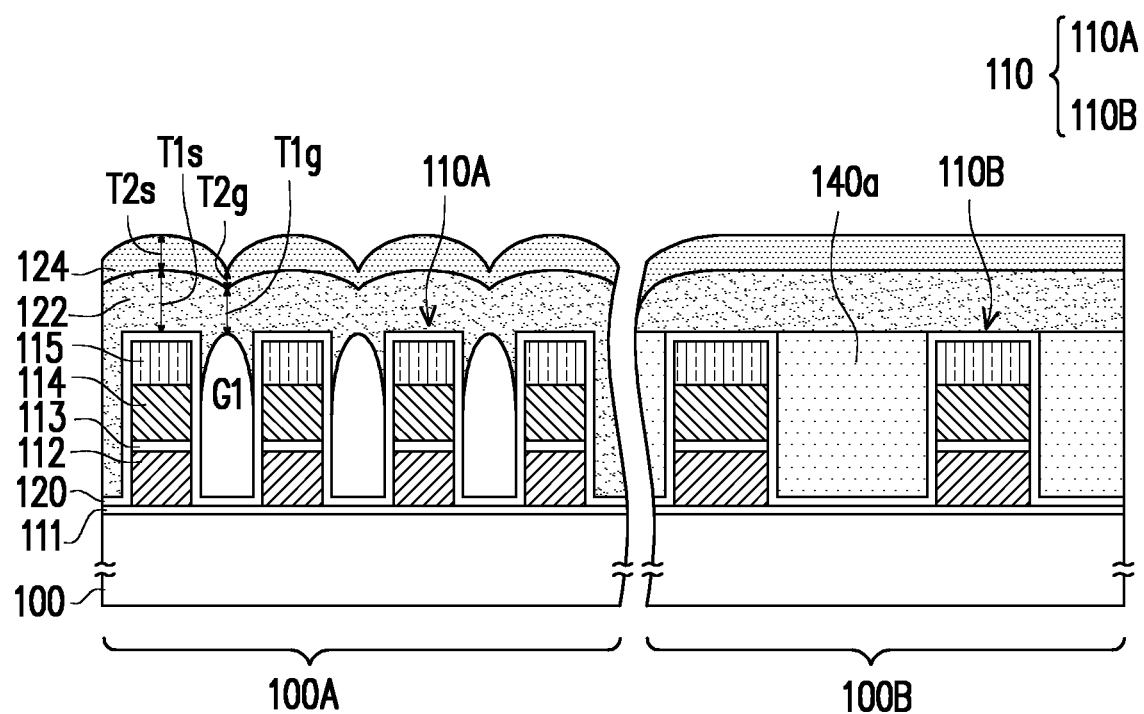
Figure 2D:
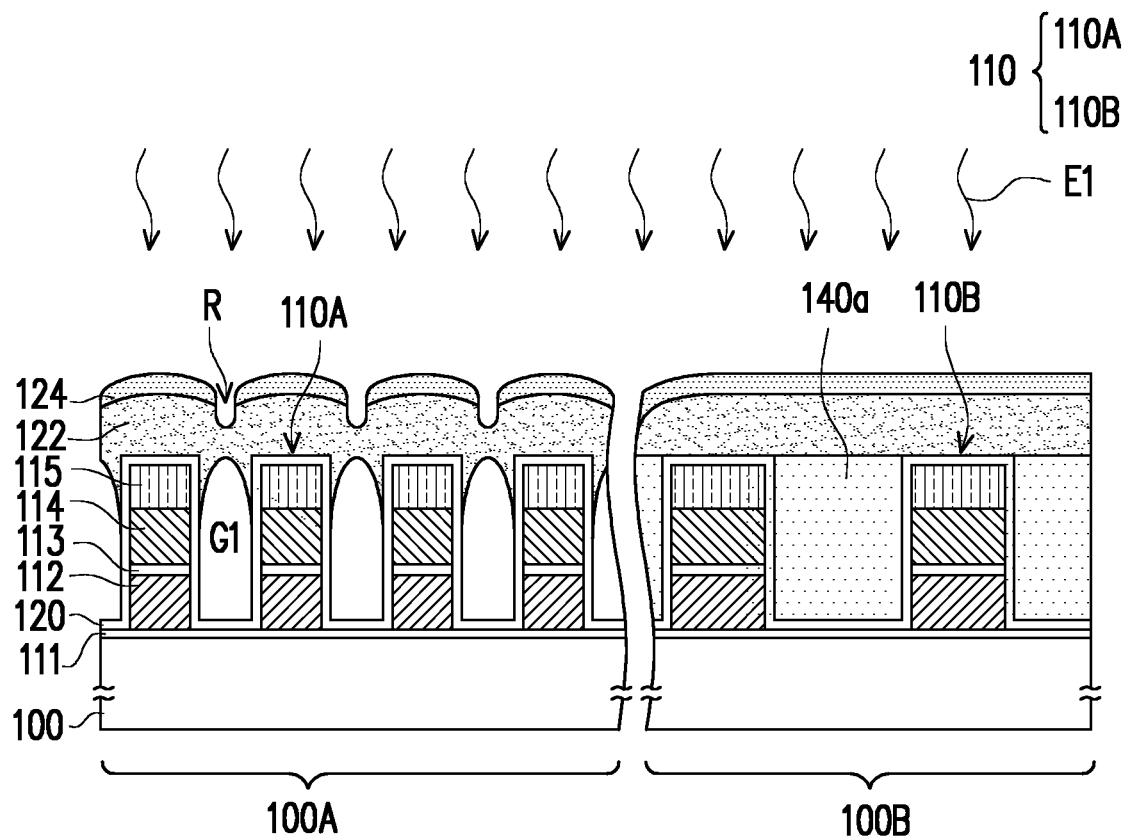
Figure 2E:
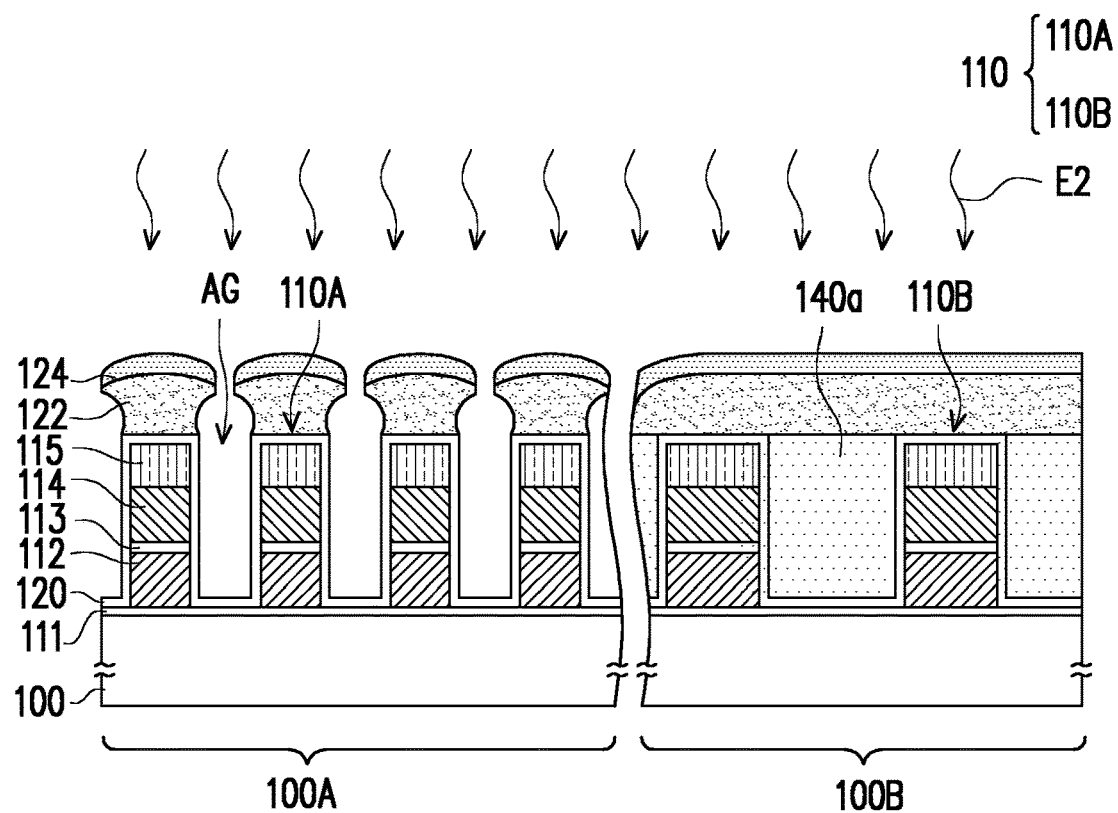
Figure 2F:
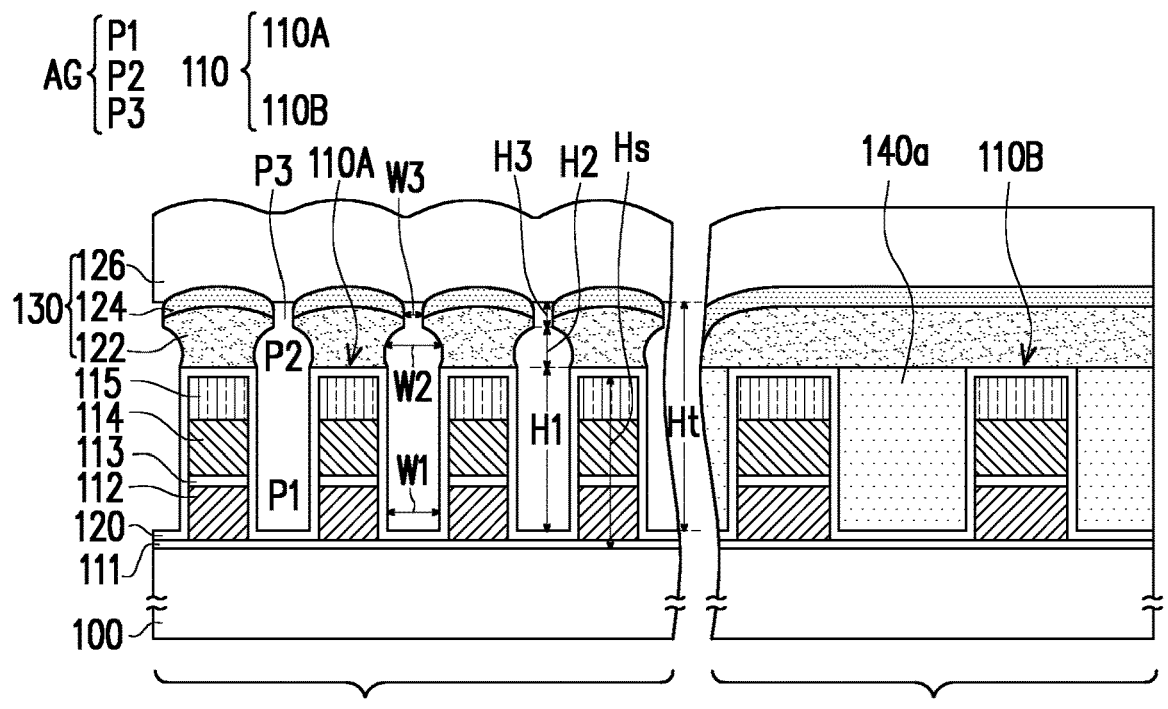
Figure 2G:
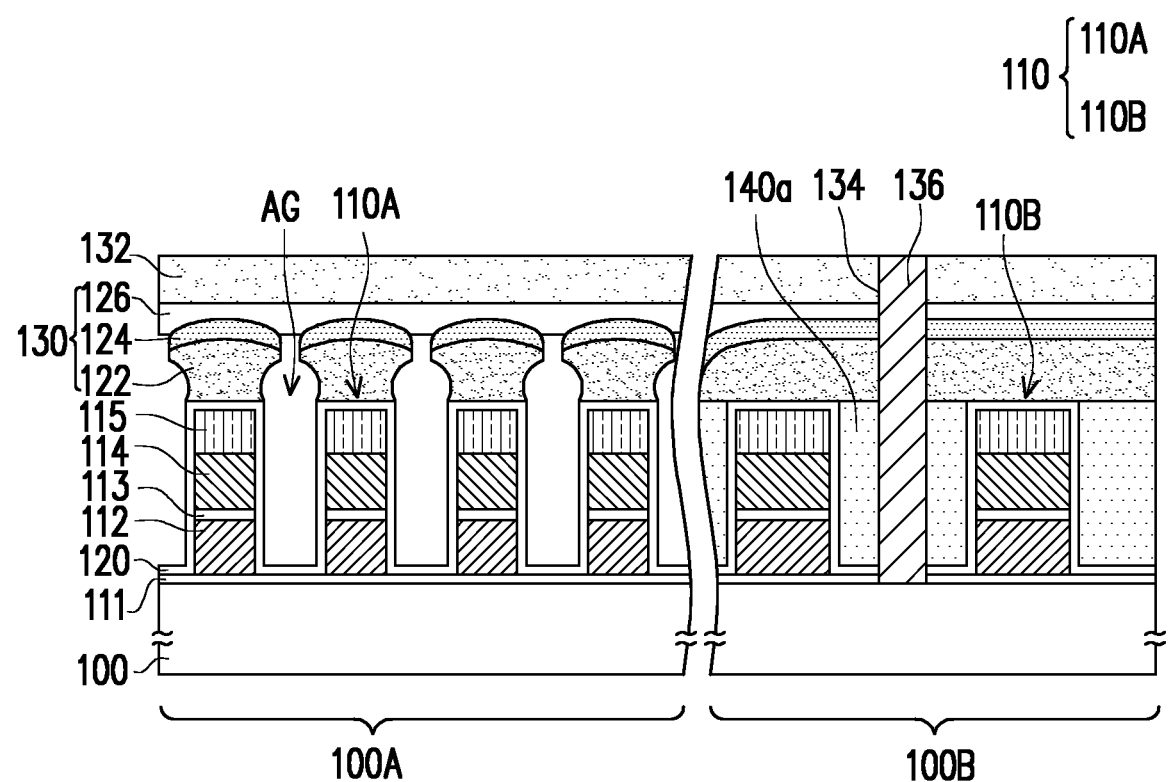

Referring to FIG. 2B, the filler layer 140 is planarized by performing a chemical mechanical polishing process to remove the filler material layer 140 in the region 100A and form a filler layer 140a in the gap G2 in the region 100B.

Referring to FIGS. 2C to 2G, a subsequent process is performed according to the above method until the conductor plug 136 is formed.

In this embodiment of the invention, by using the deposition of dielectric layers with different etching rates, the thickness difference of dielectric layers on the gate stacks and on the gaps, and the use of the wet and dry etching processes, air gaps of uniform height and shape with a large volume can be formed without the need for an additional photolithography process. Therefore, the process steps, fabricating costs could be reduced and has high reliability in the fabrication method provided in this embodiment of this invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device with an air gap, comprising:
   a plurality of gate stacks disposed on a substrate;
   a liner layer conformally covering the plurality of gate stacks and the substrate; and
   a dielectric stack disposed on the liner layer of the plurality of gate stacks,
   wherein the air gap is formed between the liner layer and the dielectric stack on two adjacent gate stacks, a height of the air gap is greater than heights of the two adjacent gate stacks, and the air gap comprises:
   a lower portion located between the two adjacent gate stacks, sidewalls and a bottom of the lower portion exposing the liner layer;
   a middle portion located above the lower portion; and
   an upper portion located above the middle portion, sidewalls of the upper portion exposing the dielectric stack, a top surface of the upper portion covered by the dielectric stack, and a width of the upper portion being smaller than a width of the lower portion.

2. The semiconductor device with the air gap as claimed in claim 1, wherein the liner layer of the lower portion of the air gap is not covered by the dielectric stack.

3. The semiconductor device with the air gap as claimed in claim 1, wherein the dielectric stack comprises:
   a first dielectric layer located on the plurality of gate stacks and having a curved upper surface;
   a second dielectric layer located on the first dielectric layer and having curved upper and lower surfaces; and
   a third dielectric layer located on the second dielectric layer and having a lower surface with a curved profile and a flat upper surface.

4. The semiconductor device having the air gap as claimed in claim 1, wherein a depth of the lower portion is substantially equal to heights of the plurality of gate stacks.

5. The semiconductor device with the air gap as claimed in claim 1, wherein a depth of the middle portion is greater than a depth of the upper portion.

6. The semiconductor device with the air gap as claimed in claim 1, wherein a width of the middle portion is greater than a width of the lower portion.

7. The semiconductor device with the air gap as claimed in claim 3, wherein a material of the second dielectric layer is different from a material of the first dielectric layer.

8. The semiconductor device with the air gap as claimed in claim 3, wherein a material of the first dielectric layer is different from a material of the liner layer.

9. The semiconductor device with the air gap as claimed in claim 3, wherein the middle portion of the air gap exposes lower sidewalls of the first dielectric layer.

10. The semiconductor device with the air gap as claimed in claim 3, wherein the upper portion of the air gap exposes upper sidewalls of the first dielectric layer and sidewalls of the second dielectric layer.

11. A semiconductor device with the air gap, comprising:
providing a substrate, wherein the substrate has a first region and a second region;
a plurality of first gate stacks disposed on the substrate in the first region;
a plurality of second gate stacks disposed on the substrate in the second region;
a liner layer conformally covering the plurality of first gate stacks, the plurality of second gate stacks and the substrate; and
a dielectric stack disposed on the liner layer of the plurality of first gate stacks and the plurality of second gate stacks,
wherein the air gap is formed between the liner layer and the dielectric stack on two adjacent first gate stacks, a height of the air gap is greater than heights of the two adjacent first gate stacks, and the air gap comprises:
a lower portion located between the two adjacent first gate stacks, sidewalls and a bottom of the lower portion exposing the liner layer;
a middle portion located above the lower portion, sidewalls of the middle portion exposing the dielectric stack; and
an upper portion located above the middle portion, sidewalls of the upper portion exposing the dielectric stack, a top surface of the upper portion covered by the dielectric stack, and a width of the lower portion being smaller than a width of the middle portion.

12. The semiconductor device with the air gap as claimed in claim 11, wherein the liner layer of the lower portion of the air gap is not covered by the dielectric stack.

13. The semiconductor device with the air gap as claimed in claim 11, wherein the dielectric stack comprises:
a first dielectric layer located on top surfaces of the plurality of first gate stacks, top surfaces of the plurality of the second gate stacks and having a curved upper surface;
a second dielectric layer located on the first dielectric layer and having curved upper and lower surfaces; and
a third dielectric layer located on the second dielectric layer and having a lower surface with a curved profile and a flat upper surface.

14. The semiconductor device with the air gap as claimed in claim 13, wherein the first dielectric layer is further located between sidewalls of the plurality of the second gate stacks and having a curved upper surface.

15. The semiconductor device with the air gap as claimed in claim 13, further comprising a filler layer located between sidewalls of the plurality of the second gate stacks, wherein the first dielectric layer is further located on the filler layer.

16. The semiconductor device with the air gap as claimed in claim 13, wherein the middle portion of the air gap exposes lower sidewalls of the first dielectric layer.

17. The semiconductor device with the air gap as claimed in claim 13, wherein the upper portion of the air gap exposes upper sidewalls of the first dielectric layer and sidewalls of the second dielectric layer.

18. The semiconductor device with the air gap as claimed in claim 13 wherein a depth of the middle portion is greater than a depth of the upper portion.

19. The semiconductor device with the air gap as claimed in claim 13 wherein a width of the lower portion is greater than a width of the upper portion.

20. The semiconductor device with the air gap as claimed in claim 13, wherein a material of the second dielectric layer is different from a material of the first dielectric layer.

* * * * *